(12) United States Patent
Goh

(10) Patent No.: US 7,671,366 B2
(45) Date of Patent: Mar. 2, 2010

(54) THIN FILM TRANSISTOR AND ORGANIC LIGHT EMITTING DEVICE INCLUDING THIN FILM TRANSISTOR

(75) Inventor: Joon-Chul Goh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 130 days.

(21) Appl. No.: 11/858,863

(22) Filed: Sep. 20, 2007

(65) Prior Publication Data

US 2008/0230768 A1    Sep. 25, 2008

(30) Foreign Application Priority Data

Mar. 21, 2007    (KR)  ............... 10-2007-0027501

(51) Int. Cl.
*H01L 33/00*    (2006.01)
(52) U.S. Cl. ............... 257/59; 257/72; 257/83; 257/E33.064; 257/E33.065
(58) Field of Classification Search ........... 257/213, 257/E31.041, E31.043, E31.045, E31.047, 257/59, 72, 83, E33.064, E33.065
See application file for complete search history.

(56) References Cited

U.S. PATENT DOCUMENTS

| | | | |
|---|---|---|---|
| 5,847,413 A * | 12/1998 | Yamazaki et al. ............. | 257/69 |
| 6,268,617 B1 | 7/2001 | Hirakata et al. | |
| 6,323,521 B1 * | 11/2001 | Seo ............................ | 257/347 |
| 2002/0093284 A1 * | 7/2002 | Adachi et al. ................ | 313/506 |
| 2005/0045889 A1 * | 3/2005 | Fryer et al. ................... | 257/72 |
| 2005/0179036 A1 | 8/2005 | Yamazaki et al. | |
| 2006/0263576 A1 * | 11/2006 | Hirose ........................ | 428/149 |
| 2007/0096135 A1 * | 5/2007 | Matsumoto .................. | 257/99 |

FOREIGN PATENT DOCUMENTS

| | | |
|---|---|---|
| JP | 06275644 | 9/1994 |
| JP | 09246566 | 9/1997 |
| JP | 09307111 | 11/1997 |
| JP | 10079514 | 3/1998 |
| JP | 11097697 | 4/1999 |
| JP | 2001196589 | 7/2001 |
| JP | 2004048036 | 2/2004 |
| KR | 1020000014518 | 3/2000 |
| KR | 100477103 | 3/2005 |
| KR | 1020060108124 | 10/2006 |
| KR | 1020060110143 | 10/2006 |

* cited by examiner

*Primary Examiner*—Minh-Loan T Tran
(74) *Attorney, Agent, or Firm*—H.C. Park & Associates, PLC

(57) ABSTRACT

The present invention relates to a thin film transistor. The thin film transistor includes a semiconductor having first, second, third, fourth, and fifth electrode regions arranged in a direction and spaced apart from each other and first, second, third, and fourth offset regions disposed between the first, second, third, fourth, and fifth electrode regions, respectively. An input electrode is connected to the third electrode region, an output electrode is connected to the first and fifth electrode regions, an insulating layer is disposed on the semiconductor, and a control electrode is disposed on the insulating layer and the second and fourth electrode regions.

20 Claims, 6 Drawing Sheets

THIN FILM TRANSISTOR AND ORGANIC LIGHT EMITTING DEVICE INCLUDING THIN FILM TRANSISTOR

CROSS-REFERENCE TO RELATED APPLICATION

This application claims priority from and the benefit of Korean Patent Application No. 10-2007-0027501, filed on Mar. 21, 2007, which is incorporated by reference for all purposes as if fully set forth herein.

BACKGROUND OF THE INVENTION

1. Field of the Invention

The present invention relates to a thin film transistor and an organic light emitting device including the thin film transistor.

2. Discussion of the Background

Active display devices such as liquid crystal displays (LCDs) and organic light emitting devices (OLEDs) include a plurality of pixels arranged in a matrix. Each pixel includes a field generating electrode and at least one transistor. The transistor may be a thin film transistor (TFT) having a semiconductor and three terminals such as a control terminal, an input terminal, and an output terminal. The thin film transistor transmits a data voltage in response to a gate signal or generates a current in proportion to the data voltage.

A display panel of the display devices may include a plurality of conductive layers and a plurality of insulating layers. The control electrode, the input and output electrodes, and the field generating electrode may be formed on the different conductive layers, respectively, and may be spaced apart from each other by the insulating layers.

When constructing the display panel, the thin film transistor may be manufactured in an inverse staggered bottom gate manner or a staggered top gate manner.

With a staggered top gate thin film transistor, the semiconductor is formed as the bottom layer, the input and output electrodes are formed on the semiconductor, and the gate electrode is formed as the top layer. The gate electrode overlaps the input and output electrodes as well as the semiconductor through the gate insulating layer.

However, near the edges of the input and output electrodes, the inclination distribution of the gate insulating layer may be different for each transistor and therefore, section shapes of the control electrodes may differ. When the section shapes of the control electrodes differ, an electric field generated by the gate electrodes may have a different shape, which may change the current amount driven by the transistors.

To prevent the above problems, the control electrodes may be designed such that the input and output electrodes do not overlap the control electrodes, and offset regions may be generated in semiconductor portions between the control electrodes and the input and output electrodes.

The display panel may be manufactured by an exposing process, an etching process, etc. When a mother substrate for manufacturing the display panel is larger than a predetermined size, the mother substrate may be divided into several regions and the exposing process may be sequentially performed for each region (partition exposure).

However, in the exposing process, an alignment error may occur due to shifting, rotation, or distortion of a mask. In addition, even when partition exposure is not performed, an alignment error may occur because of inaccuracies caused by the exposure equipment.

In particular, when the distance between the control electrode and the input electrode of the thin film transistor and the distance between the control electrode and the output electrode of the thin film transistor are different, the distances of the offset regions at the sides of the control electrodes are different, and therefore, the resistance of the offset regions and current amount based on the resistance may deviate.

SUMMARY OF THE INVENTION

The present invention provides a thin film transistor having substantially uniform offset resistance.

The present invention also provides an organic light emitting device including the thin film transistor.

Additional features of the invention will be set forth in the description which follows, and in part will be apparent from the description, or may by learned by practice of the invention.

The present invention discloses a thin film transistor including a semiconductor having a first electrode region, a second electrode region, a third electrode region, a fourth electrode region, and a fifth electrode region arranged in a first direction and spaced apart from each other with a first offset region, a second offset region, a third offset region, and a fourth offset region disposed therebetween, respectively. An input electrode is connected to the third electrode region, an output electrode is connected to the first electrode region and the fifth electrode region, and an insulating layer is disposed on the semiconductor. A control electrode is disposed on the insulating layer, second electrode region, and the fourth electrode region.

The present invention also discloses an organic light emitting device including an organic light emitting element connected to a common voltage, a driving transistor connected to the organic light emitting element and a driving voltage, a switching transistor connected to the driving transistor, a gate line connected to the switching transistor, and a data line connected to the switching transistor and insulated from the gate line.

The driving transistor includes a crystalline semiconductor having a first electrode region, a second electrode region, a third electrode region, a fourth electrode region, and a fifth electrode region arranged in a first direction and spaced apart from each other with a first offset region, a second offset region, a third offset region, and a fourth offset region disposed therebetween, respectively. A first input electrode is connected to the third electrode region and the driving voltage and a first output electrode is connected to the first electrode region, the fifth electrode region, and the organic light emitting element. A gate insulating layer is disposed on the crystalline semiconductor. A first control electrode is disposed on the gate insulating layer, the second electrode region, and the fourth electrode region and connected to the switching transistor.

The present invention also discloses a thin film transistor including a semiconductor extending in a first direction, a first electrode insulated from the semiconductor and crossing the semiconductor in a first area and a second area, a second electrode contacting the semiconductor at a third area, the third area being between the first area and the second area, and a third electrode contacting the semiconductor at a fourth area and a fifth area, the first area being between the third area and the fourth area, and the second area being between the third area and the fifth area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part this specification, illustrate embodiments of the invention, and together with the description serve to explain the principles of the invention.

DETAILED DESCRIPTION OF THE ILLUSTRATED EMBODIMENTS

Figure 1:
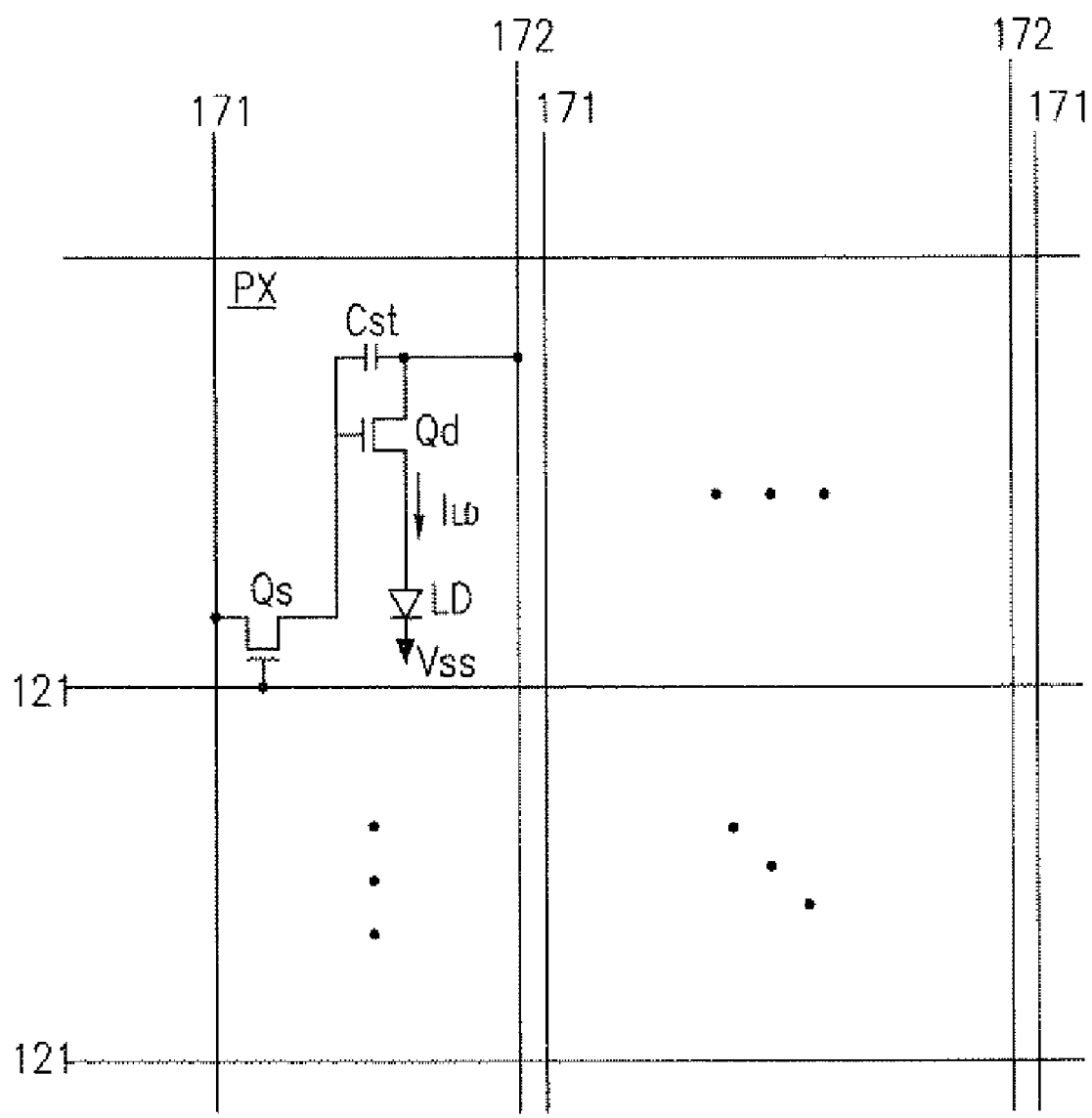
FIG. 1 is an equivalent circuit diagram of an OLED according to an exemplary embodiment of the present invention.

The invention will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" or "connected to" another element, it can be directly on or directly connected to the other element or intervening elements may be present therebetween. In contrast, when an element is referred to as being "directly on" or "directly connected to" another element, there are no intervening elements present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top" may be used herein to describe the relationship of one element to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on the "upper" side of the other elements. The exemplary term "lower" can therefore encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross-sectional illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

An OLED as an example of a flat display device according to an exemplary embodiment of the present invention will be described with reference to FIG. 1.

FIG. 1 is an equivalent circuit diagram of an OLED according to an exemplary embodiment of the present invention.

Referring to FIG. 1, an OLED according to an exemplary embodiment of the present invention includes a plurality of signal lines 121, 171, and 172 and a plurality of pixels PX connected thereto and arranged substantially in a matrix.

The signal lines include a plurality of gate lines 121 to transmit gate signals (or scanning signals), a plurality of data lines 171 to transmit data signals, and a plurality of driving voltage lines 172 to transmit a driving voltage. The gate lines 121 extend parallel to each other in a row direction, while the data lines 171 and the driving voltage lines 172 extend parallel to each other in a column direction.

Each pixel PX includes a switching transistor Qs, a driving transistor Qd, a capacitor Cst, and an organic light emitting diode LD.

The switching transistor Qs, which may be a TFT, has a control terminal connected to a gate line 121, an input terminal connected to a data line 171, and an output terminal connected to the driving transistor Qd. The switching transistor Qs transmits a data signal applied to the data line 171 to the driving transistor Qd in response to the gate signal applied to the gate line 121.

The driving transistor Qd has a control terminal connected to the switching transistor Qs, an input terminal connected to a driving signal line 172, and an output terminal connected to the organic light emitting diode LD. The driving transistor Qd drives an output current $I_{LD}$ having a magnitude depending on the voltage between the control terminal and the input terminal thereof.

The capacitor Cst is connected between the control terminal and the input terminal of the driving transistor Qd. The capacitor Cst stores the data signal applied to the control terminal of the driving transistor Qd and maintains the data signal after the switching transistor Qs is turned off.

The organic light emitting diode LD has an anode connected to the output terminal of the driving transistor Qd and a cathode connected to a common voltage Vss. The organic light emitting diode LD emits light having an intensity depending on the output current $I_{LD}$ of the driving transistor Qd, thereby displaying images.

The switching transistor Qs and the driving transistor Qd may be n-channel field effect transistors (FETs). However, at least one of switching transistor Qs and driving transistor Qd may be a p-channel FET. In addition, the connections among the transistors Qs and Qd, the capacitor Cst, and the organic light emitting diode LD may be modified.

Figure 2:
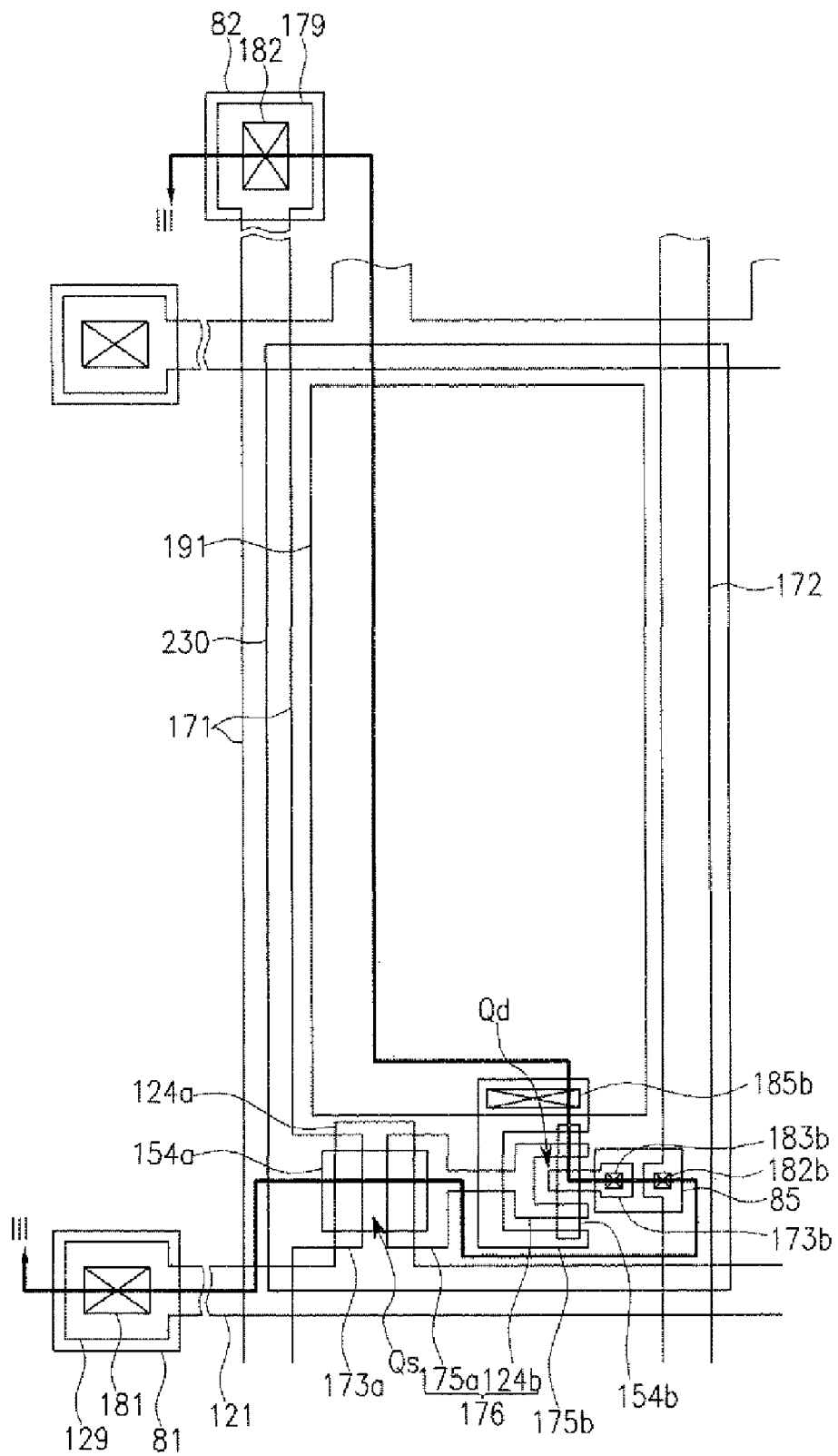
FIG. 2 is a layout view with respect to one pixel of an OLED according to an exemplary embodiment of the present invention.
Figure 3:
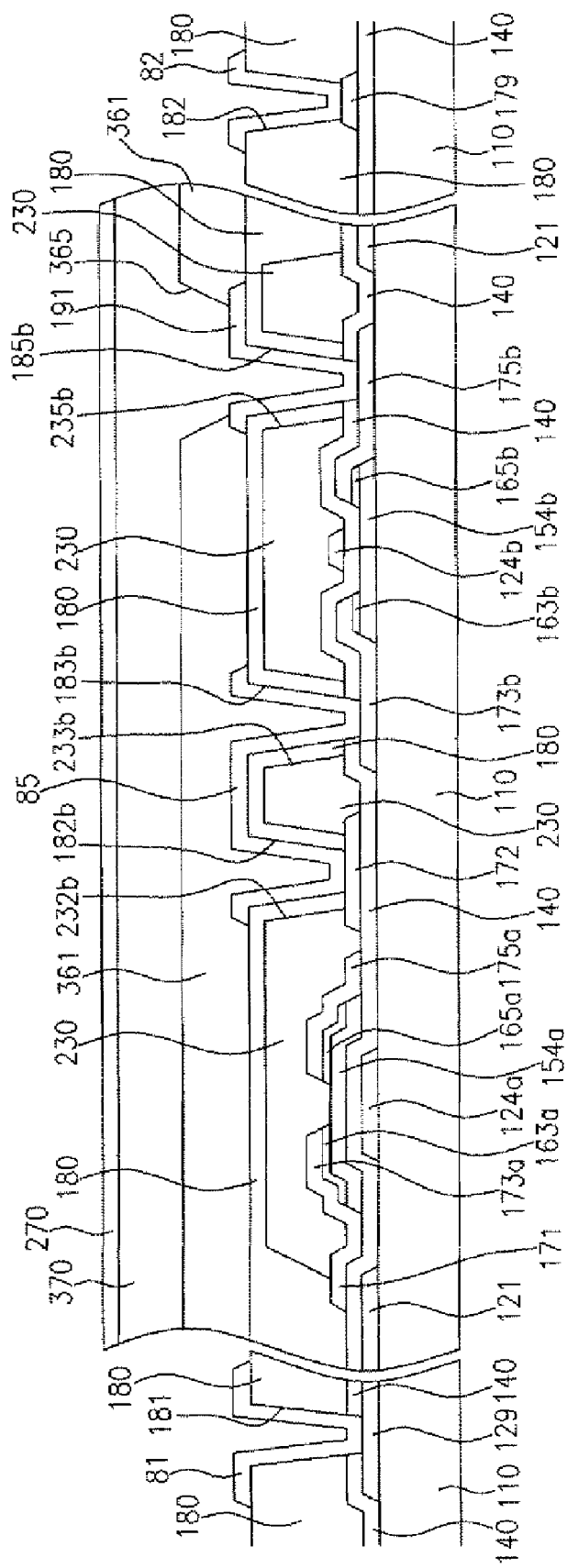
FIG. 3 is a sectional view of the OLED shown in FIG. 2 taken along line III-III.

Referring to FIG. 2 and FIG. 3, a detailed structure of the OLED shown in FIG. 1 according to an exemplary embodiment of the present invention will be described in detail.

FIG. 2 is a layout view of an OLED according to an exemplary embodiment of the present invention, and FIG. 3 is a sectional view of the OLED shown in FIG. 2 taken along line III-III.

A plurality of semiconductor islands 154b (referred to as "driving semiconductors") for the driving transistor Qd is disposed on an insulating substrate 110, which may be made of a material such as transparent glass or plastic. The driving semiconductors 154b may be made of a crystalline semiconductor material such as microcrystalline silicon or polycrystalline silicon.

Two ohmic contacts 163b and 165b (referred to as "driving ohmic contacts") for the driving transistor Qd are formed on the driving semiconductors 154b, respectively. The driving ohmic contacts 163b and 165b may have island shapes, respectively, and may be sequentially disposed in a vertical direction. The driving ohmic contacts 163b and 165b may be made of a crystalline semiconductor material such as microcrystalline silicon or polycrystalline silicon heavily doped with an n-type impurity such as phosphorous.

A plurality of gate lines 121, a plurality of input electrodes 173b (referred to as "driving input electrodes") for the driving transistor Qd, and a plurality of output electrodes 175b (referred to as "driving output electrodes") for the driving transistor Qd may be formed on the substrate 110 and the driving ohmic contacts 163b and 165b.

The gate lines 121 transmit gate signals and extend substantially in a transverse direction. Each gate line 121 further includes an end portion 129 having a large area to contact another layer or an external driving circuit, and a control electrode 124a (referred to as "switching control electrode") to control the switching transistor Qs projecting upward from the gate line 121. The gate lines 121 may extend to be directly connected to a gate driving circuit (not shown) to generate the gate signals. The gate driving circuit may be integrated with the substrate 110.

The driving input electrodes 173b and the driving output electrodes 175b are spaced apart from each other and are disposed on the respective driving ohmic contacts 163b and 165b corresponding thereto and the substrate 110. Each driving output electrode 175b branches into two branches disposed on respective sides of the driving input electrode 173b.

The driving ohmic contacts 163b and 165b are interposed between the underlying driving semiconductor 154b and the overlying driving input and output electrodes 173b and 175b thereon, and reduce the contact resistance therebetween. Each driving semiconductor 154b includes an exposed portion, which is not covered by the driving ohmic contacts 163b and 165b, the driving input electrode 173b, or the driving output electrode 175b, between the driving input electrode 173b and the driving output electrode 175b.

Exemplary embodiments of the gate lines 121, the driving input electrodes 173b, and the driving output electrodes 175b may be made of a refractory metal such as Mo, Cr, Ta, Ti, or alloys thereof. Exemplary embodiments of the gate lines 121, the driving input electrodes 173b, and the driving output electrodes 175b may have a multi-layered structure including a lower refractory metal film (not shown) and an upper low resistivity film (not shown). One exemplary embodiment of the multi-layered structure is a double-layered structure including a lower Cr/Mo alloy film and an upper Al alloy film. Another exemplary embodiment of the multi-layered structure is a triple-layered structure including a lower Mo alloy film, an intermediate Al alloy film, and an upper Mo alloy film. However, the gate lines 121, the driving input electrodes 173b, and the driving output electrodes 175b may be made of various other metals or conductors.

The lateral sides of the gate lines 121, the driving input electrodes 173b, and the driving output electrodes 175b may be inclined relative to a surface of the substrate 110, and the inclination angle thereof may range from about 30 degrees to about 80 degrees.

An insulating layer 140, which may be made of silicon oxide ($SiO_2$) or silicon nitride (SiNx), may be formed on the gate lines 121, the driving input electrodes 173b, the driving output electrodes 175b, and the exposed driving semiconductors 154b.

A plurality of semiconductor islands 154a (referred to as "switching semiconductors") for the switching transistors Qs, which may be made of hydrogenated amorphous silicon, are formed on the gate insulating layer 140. The switching semiconductors 154a are disposed on the switching control electrodes 124a.

A plurality of pairs of ohmic contacts 163a and 165a (referred to as "switching ohmic contacts" for the switching transistors Qs are formed on the switching semiconductors 154a. The switching ohmic contacts 163a and 165a may have island shapes and may be made of a material such as n+ hydrogenated a-Si heavily doped with an n-type impurity such as phosphorous.

A plurality of data lines 171, a plurality of driving voltage lines 172, and a plurality of electrode members 176 are formed on the switching ohmic contacts 163a and 165a, and on the gate insulating layer 140.

The data lines 171, which transmit data signals, extend substantially in the longitudinal direction and cross the gate lines 121. Each data line 171 includes a plurality of input electrodes 173a (referred to as "switching input electrodes") for the switching transistors Qs extending toward the switching control electrodes 124a and an end portion 179 having a large area to contact another layer or an external driving circuit. The data lines 171 may extend to be directly connected to a data driving circuit (not shown) to generate the data signals. The data driving circuit may be integrated with the substrate 110.

The driving voltage lines 172, which transmit driving voltages, extend substantially in the longitudinal direction and cross the gate lines 121.

The electrode members 176 are spaced apart from the data lines 171 and the driving voltage lines 172. Each electrode member 176 includes an output electrode 175a (referred to as "a switching output electrode") for the switching transistor Qs and a control electrode 124b (referred to as "a driving control electrode") for the driving transistor Qd.

The switching output electrode 175a is disposed on the switching ohmic contact 165a and faces the switching input electrode 173a.

The driving control electrode 124b branches into two branches to be disposed on the driving semiconductor 154b. The branches of the driving control electrode 124b are disposed between the driving input electrode 173b and the driving output electrode 175b, respectively.

The data lines 171, the driving voltage lines 172, and the electrode members 176 may be made of the same material as the gate lines 121.

The lateral sides of the data lines 171, the driving voltage lines 172, and the electrode members 176 may be inclined relative to a surface of the substrate 110, and the inclination angle thereof may be about 30 degrees to about 80 degrees.

The switching ohmic contacts 163a and 165a are interposed between the underlying switching semiconductor 154a and the overlying data lines 171 and electrode members 176 thereon, and reduce the contact resistance therebetween. The switching semiconductor 154a includes an exposed portion, which is not covered by the switching ohmic contacts 163a and 165a, the switching input electrode 173a, or the switching output electrode 175a, between the switching input electrode 173a and the switching output electrode 175a.

A plurality of color filters 230 is formed on the data lines 171, the driving voltage lines 172, the electrode members 176, and the exposed switching semiconductors 154a. However, when the OLED includes white pixels, the color filters 230 may be omitted or may be transparent filters (not shown) on portions corresponding to the white pixels.

The color filters 230 cover portions of the data lines 171 and the entire width of the driving voltage lines 172 and include a plurality of openings 232b, 233b, and 235b. The opening 232b exposes the driving voltage line 172, the opening 233b exposes the driving input electrode 173b, and the opening 235b exposes the driving output electrode 175b.

Edges of two adjacent color filters 230 may overlap each other on the data lines 171 and the gate lines 121, and the overlapping portions of the color filters 230 may block light leakage between the pixels.

An interlayer insulating layer (not shown) may be formed on the color filters 230. The interlayer insulating layer may prevent pigments of the color filters 230 from flowing to the switching semiconductors 154a.

A passivation layer 180 is formed on the color filters 230, the data lines 171, the driving voltage lines 172, and the electrode member 176. The passivation layer 180 may be an inorganic insulator, an organic insulator, etc., and may have a flat surface. Examples of the material for the inorganic insulator include silicon nitride and silicon oxide. The organic insulator may have photosensitivity and a dielectric constant thereof may be about 4.0 or less.

The passivation layer 180 has a plurality of contact holes 182 and 182b exposing the end portions 179 of the data lines 171 and the driving voltage lines 172 through the openings 232b, respectively. The passivation layer 180 and the gate insulating layer 140 have a plurality of contact holes 181, 183b, and 185b exposing the end portions 129 of the gate lines 121, the driving input electrodes 173b through the openings 233b, and the driving output electrodes 175b through the openings 235b, respectively.

A plurality of pixel electrodes 191, a plurality of connecting members 85, and a plurality of contact assistants 81 and 82 are formed on the passivation layer 180.

The pixel electrodes 191 are connected to the driving output electrodes 175b through the contact holes 185b.

The connecting members 85 are connected to the driving voltage lines 172 and the driving input electrodes 173b through the contact holes 182b and 183b, respectively, and portions of the connecting members 85 overlap the driving control electrodes 124b to form storage capacitors Cst.

The contact assistants 81 and 82 are connected to the end portions 129 and 179 of the gate lines 121 and the data lines 171 through the contact holes 181 and 182, respectively. The contact assistants 81 and 82 protect the end portions 129 and 179 and enhance the adhesion between the end portions 129 and 179 and external devices.

The pixel electrodes 191, the connecting members 85, and the contact assistants 81 and 82 may be made of a transparent conductor such as ITO or IZO.

An insulating bank 361 is formed on the pixel electrodes 191 and the connecting members 85. The bank 361 may surround edges of the pixel electrodes 191 to define openings 365.

A plurality of light emission layers 370 emitting white light is formed on the bank 361 and the pixel electrodes 191.

The light emission layers 370 may be made of an organic material emitting one of the primary color lights such as red, green, or blue. Light emitting layer 370 that emit different colors may be stacked on each other or may be formed adjacent to each other.

The light emission layers 370 may be a high molecular weight compound or a low molecular weight compound. Examples of the high molecular weight compound include a polyfluorene derivative, a (poly)paraphenylenevinylene derivative, a polyphenylene derivative, polyvinylcarbazole, a polythiophene derivative, etc. Examples of the low molecular weight compound include anthracene such as 9,10-diphenylanthracene, butadiene such as tetraphenylbutadiene, tetracene, a distyrylarylene derivative, a benzazole derivative, a carbazole derivative, etc. Alternatively, the high or low molecular weight compound may be used as a host. The host is doped by a dopant such as xanthene, perylene, cumarine, rhodamine, rubrene, a dicyanomethylenepyran compound, a thiopyran compound, a (thia)pyrilium compound, a periflanthene derivative, an indenoperylene derivative, a carbostyryl compound, Nile red, and quinacridone to enhance the efficiency of light emission.

Each light emission layer 370 may be formed with an auxiliary layer (not shown) on both side of the light emission layers 370 to improve the light emission efficiency of the light emission layers 370.

The auxiliary layers may include an electron transport layer (not shown) and a hole transport layer (not shown) to improve the balance of the electrons and holes and an electron injecting layer (not shown) and a hole injecting layer (not shown) to improve the injection of the electrons and holes.

A common electrode 270 is formed on the light emission layers 370. The common electrode 270 is supplied with a common voltage Vss, and may include a metal having a low work function and high reflectivity. Examples of the metal include Al, Au, Pt, Ni, Cu, W, and alloys thereof.

In this OLED, a pixel electrode 191, a light emission layer 370, and the common electrode 270 form an organic light emitting diode LD having the pixel electrode 191 as an anode and the common electrode 270 as a cathode, or vice versa.

In the above-described OLED, a switching control electrode 124a connected to a gate line 121, a switching input electrode 173a connected to a data line 171, and a switching output electrode 175a along with a switching semiconductor island 154a form a switching transistor Qs having a channel formed in the switching semiconductor island 154a disposed between the switching input electrode 173a and the switching output electrode 175a.

Likewise, a driving control electrode 124b connected to a switching output electrode 175a, a driving input electrode 173b connected to a driving voltage line 172, and a driving output electrode 175b connected to a pixel electrode 191 along with a driving semiconductor island 154b form a driving transistor Qd having a channel formed in the driving semiconductor island 154b disposed between the driving input electrode 173b and the driving output electrode 175b.

As described above, the switching semiconductor islands 154a may be made of an amorphous semiconductor material, and the driving semiconductor islands 154b may be made of a crystalline semiconductor material.

Thereby, in this exemplary embodiment, the channels of the switching transistor Qs and the driving transistor Qd are formed on different semiconductors having different crystalline states from each other, which may simultaneously provide the characteristics required for the respective switching and driving transistors Qs and Qd.

Since the crystalline semiconductor used in the driving transistors Qd has high carrier mobility, the current flowing in an organic light emitting diode LD may increase to improve the luminance of the organic light emitting diode LD. In addition, since driving transistor Qd using crystalline semiconductor may highly reduce threshold voltage mobility, image deterioration such as image sticking may be decreased.

Since the amorphous semiconductor used in the switching transistor Qs reduces off current, the data voltage drop may be prevented and cross talk may be decreased.

Alternatively, each pixel PX may further include a separate transistor to prevent or compensate the deterioration of the organic light emitting diode LD and the driving transistor Qd in addition to the switching transistor Qs and the driving transistor Qd.

Now, a construction of the driving transistor of the OLED shown in FIG. 2 and FIG. 3 will be described with reference to FIG. 4, FIG. 5, FIG. 6, and FIG. 7 in detail.

Figure 4:
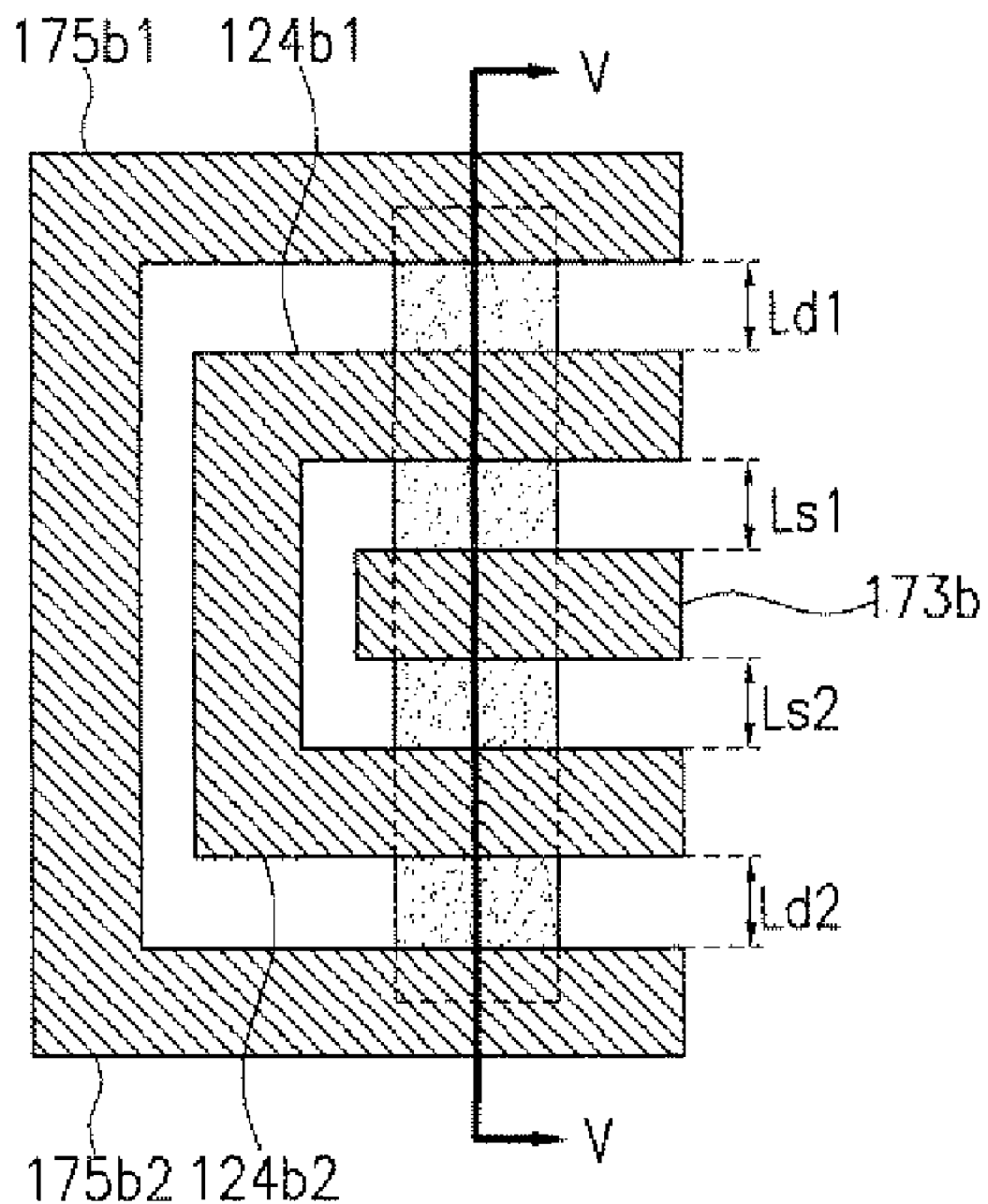
FIG. 4 is a schematic diagram showing a driving transistor according to an exemplary embodiment of the present invention.
Figure 5:
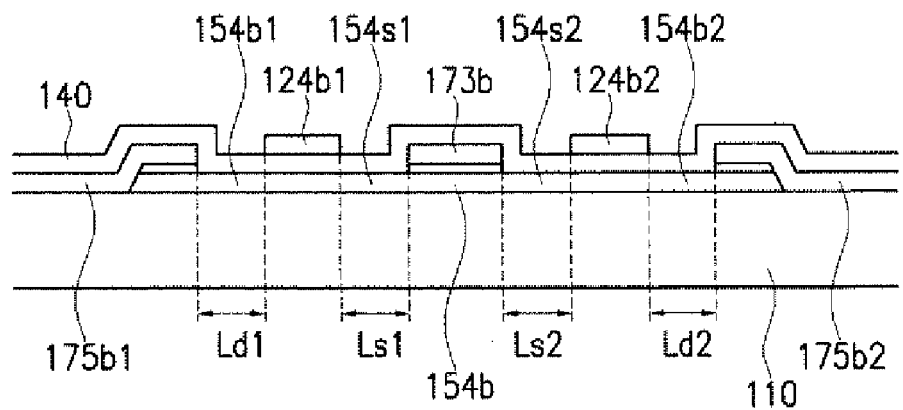
FIG. 5 is a sectional view of the driving transistor shown in FIG. 4 taken along line V-V.
Figure 6:
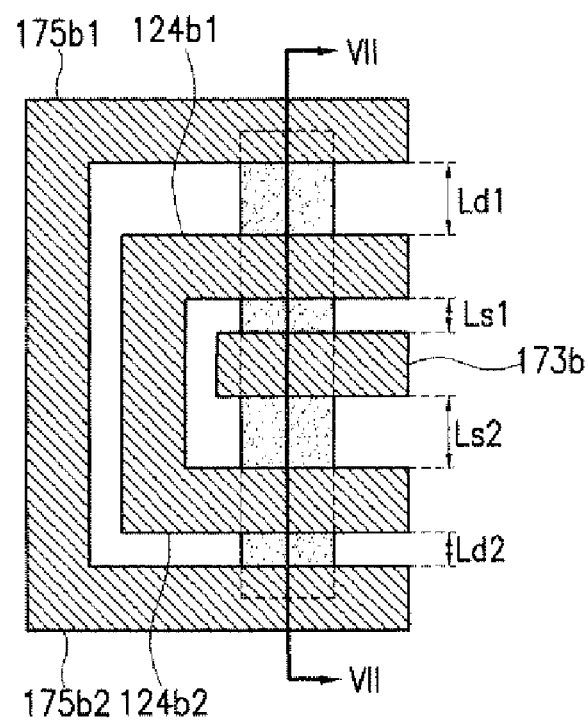
FIG. 6 is a schematic diagram showing a driving transistor according to another exemplary embodiment of the present invention.
Figure 7:
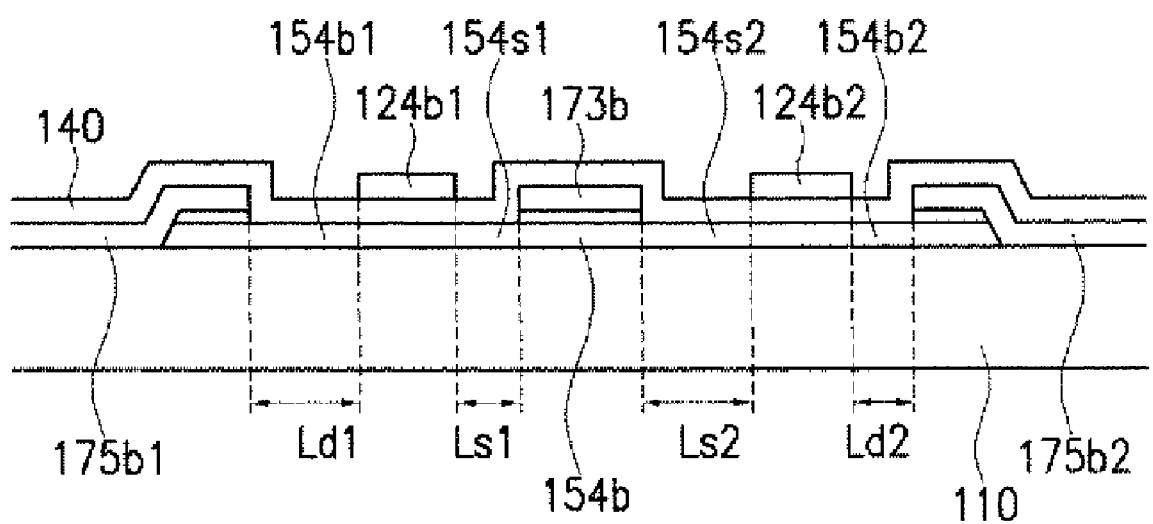
FIG. 7 is a sectional view of the driving transistor shown in FIG. 6 taken along line VII-VII.

FIG. 4 is a schematic diagram showing a driving transistor according to an exemplary embodiment of the present invention, FIG. 5 is a sectional view of the driving transistor shown in FIG. 4 taken along line V-V, FIG. 6 is a schematic diagram showing a driving transistor according to another exemplary embodiment of the present invention, and FIG. 7 is a sectional view of the driving transistor shown in FIG. 6 taken along line VII-VII.

FIG. 4 and FIG. 5 show a construction in which the input electrode 173b and the output electrode 175b are symmetrically disposed with respect to the control electrode 124b. That is, the distance Ld1 from a first branch 175b1 of the output electrode 175b to the first branch 124b1 of the control electrode 124b, the distance Ls1 from a first branch 124b1 of the control electrode 124b to the input electrode 173b, a distance Ls2 from the input electrode 173b to a second branch 124b2 of the control electrode 124b, and the distance Ld2 from the second branch 124b2 of the control electrode 124b to the second branch 175b2 of the output electrode 175b are the same. In other words, the four offset regions 154b1, 154s1, 154s2, and 154b2 of the semiconductor 154b all have the same width.

Therefore, the resistance of the offset regions 154s1 and 154s2 between the control electrode 124b and the input electrode 173b may be the same as the resistance of the offset regions 154b1 and 154b2 between the control electrode 124b and the output electrode 175b.

Regions of the semiconductor 154b other than the offset regions 154s1, 154b1, 154s2, and 154b2, that is, electrode regions, may be connected to or overlap the input electrode 173b, two branches 175b1 and 175b2 of the output electrode 175b, and two branches 124b1 and 124b2 of the control electrode 124b.

FIG. 6 and FIG. 7 show a construction in which the input electrode 173b and the output electrode 175b lean upward with respect to the control electrode 124b. That is, the width Ls1 of the offset region 154s1 is different from the width Ld1 of the offset region 154b1, and the width Ls2 of the offset region 154s2 is different from the width Ld2 of the offset region 154b2.

Compared with FIG. 4 and FIG. 5, as the width Ls1 of the offset region 154s1 decreases, the width Ld1 of the offset region 154b1 increases, and as the width Ls2 of the offset region 154s2 increases, the width Ld2 of the offset region 154b2 decreases. In addition, the decrement of the width Ls1 of the offset region 154s1 is the same as the increment of the width Ls2 of the offset region 154s2, and the increment of the width Ld1 of the offset region 154b1 is the same as the decrement of the width Ld2 of the offset region 154b2.

Thus, the sum (=Ls1+Ls2) of the widths of the offset regions 154s1 and 154s2 between the control electrode 124b and the input electrode 173b is the same as the sum (=Ld1+Ld2) of the widths of the offset regions 154b1 and 154b2 of the control electrode 124b and the output electrode 175b. Accordingly, the resistance of the input terminal of the driving transistor Qd is the same as that of the output terminal of the driving transistor Qd, which may make the current driven by the driving transistor Qd uniform.

The above-described OLED adopts a bottom-emission type that emits light toward the bottom of the substrate 110 to display images. However, exemplary embodiments of the present invention may be adopted in an OLED of a top-emission type that includes opaque pixel electrodes and a transparent common electrode and emits light toward the top of the substrate 110 to display images. In this case, the color filters 230 are disposed on the emission layers 370.

Exemplary embodiments of the present invention may be adopted in an OLED having a different construction from the above OLED, or in display devices such as liquid crystal displays.

According to exemplary embodiments of the present invention, regardless of an arrangement error and an arrangement deviation, TFTs having substantially uniform offset resistance may be obtained.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor, comprising:
   a semiconductor having a first electrode region, a second electrode region, a third electrode region, a fourth electrode region, and a fifth electrode region arranged in a first direction and spaced apart from each other, and a first offset region, a second offset region, a third offset region, and a fourth offset region disposed between the first electrode region, the second electrode region, the third electrode region, the fourth electrode region, and the fifth electrode region, respectively;
   an input electrode connected to the third electrode region;
   an output electrode connected to the first electrode region and the fifth electrode region;
   an insulating layer disposed on the semiconductor; and
   a control electrode disposed on the insulating layer, the second electrode region, and the fourth electrode region,
   wherein each of the control electrode and the input electrode intersects the semiconductor.

2. The thin film transistor of claim 1, wherein the semiconductor is polycrystalline silicon or microcrystalline silicon.

3. The thin film transistor of claim 1, further comprising a plurality of ohmic contacts positioned between the semiconductor and the input electrode and the output electrode.

4. The thin film transistor of claim 3, wherein the ohmic contacts comprise polycrystalline silicon or microcrystalline silicon that comprises an impurity.

5. The thin film transistor of claim 1, wherein the insulating layer comprises silicon nitride or silicon oxide.

6. An organic light emitting device, comprising:
   an organic light emitting element connected to a common voltage;
   a driving transistor connected to the organic light emitting element and a driving voltage;
   a switching transistor connected to the driving transistor;
   a gate line connected to the switching transistor; and
   a data line connected to the switching transistor and insulated from the gate line,
   wherein the driving transistor comprises:
   a crystalline semiconductor having a first electrode region, a second electrode region, a third electrode region, a fourth electrode region, and a fifth electrode region arranged in a first direction and spaced apart from each other and a first offset region, a second offset region, a third offset region, and a fourth offset region disposed between the first electrode region, the second electrode region, the third electrode region, the fourth electrode region, and the fifth electrode region, respectively,
   a first input electrode connected to the third electrode region and the driving voltage,
   a first output electrode connected to the first electrode region, the fifth electrode region, and the organic light emitting element,
   a gate insulating layer disposed on the crystalline semiconductor, and
   a first control electrode disposed on the gate insulating layer, the second electrode region, and the fourth electrode region, and connected to the switching transistor,
   wherein each of the control electrode and the input electrode intersects the semiconductor.

7. The organic light emitting device of claim 6, wherein the switching transistor comprises an amorphous semiconductor disposed on the gate insulating layer.

8. The organic light emitting device of claim 7, wherein the switching thin film transistor further comprises:
   a second control electrode disposed under the gate insulating layer and connected to the gate line;
   a second input electrode disposed on the amorphous semiconductor and connected to the data line; and
   a switching output electrode disposed on the amorphous semiconductor, spaced apart from the second input electrode, and connected to the first control electrode.

9. The organic light emitting device of claim 6, wherein the driving transistor further comprises a plurality of ohmic contacts disposed between the crystalline semiconductor and the first input electrode and the first output electrode.

10. The organic light emitting device of claim 9, wherein the ohmic contacts comprise polycrystalline silicon or microcrystalline silicon that comprises an impurity.

11. The organic light emitting device of claim 6, wherein the gate insulating layer comprises silicon nitride or silicon oxide.

12. The organic light emitting device of claim 6, further comprising a color filter overlapping the organic light emitting element, wherein the organic light emitting element emits white light.

13. A thin film transistor, comprising:
   a semiconductor extending in a first direction;
   a first electrode insulated from the semiconductor and intersecting the semiconductor in a first area and a second area;
   a second electrode contacting the semiconductor at a third area, the third area being between the first area and the second area; and
   a third electrode contacting the semiconductor at a fourth area and a fifth area, the first area being between the third area and the fourth area, and the second area being between the third area and the fifth area,
   wherein the second electrode intersects the semiconductor.

14. The thin film transistor of claim 13, wherein the first electrode comprises a first branch and a second branch perpendicular to the semiconductor, the second electrode comprises one branch perpendicular to the semiconductor, and the third electrode comprises a first branch and a second branch perpendicular to the semiconductor.

15. The thin film transistor of claim 14, wherein the first branch of the third electrode, the first branch of the first electrode, the branch of the second electrode, the second branch of the first electrode, and the second branch of the third electrode are sequentially disposed.

16. The thin film transistor of claim 15, wherein the distance between the first branch of the third electrode and the first branch of the first electrode, the distance between the first branch of the first electrode and the branch of the second electrode, the distance between the branch of the second electrode and the second branch of the first electrode, and the distance between the second branch of the first electrode and the second branch of the third electrode are all the same.

17. The thin film transistor of claim 15, wherein the sum of the distance between the first branch of the first electrode and the branch of the second electrode and the distance between the branch of the second electrode and the second branch of the first electrode equals the sum of the distance between the first branch of the third electrode and the first branch of the first electrode and the distance between the second branch of the first electrode and the second branch of the third electrode.

18. The thin film transistor of claim 13, wherein the semiconductor is polycrystalline silicon or microcrystalline silicon.

19. The thin film transistor of claim 13, further comprising a plurality of ohmic contacts positioned between the semiconductor and the second electrode and the third electrode.

20. The thin film transistor of claim 19, wherein the ohmic contacts comprise polycrystalline silicon or microcrystalline silicon that includes an impurity.

* * * * *